United States Patent [19]

Mishiro

[11] 4,065,687

[45] Dec. 27, 1977

[54] SUPERSONIC VIBRATOR WITH MEANS FOR DETECTING VIBRATING SPEED

[75] Inventor: Shoji Mishiro, Tokyo, Japan

[73] Assignee: Taga Electric Co., Ltd., Tokyo, Japan

[21] Appl. No.: 680,983

[22] Filed: Apr. 28, 1976

Related U.S. Application Data

[63] Continuation of Ser. No. 497,282, Aug. 14, 1974, abandoned, which is a continuation of Ser. No. 345,530, March 28, 1973, Pat. No. 3,843,897.

[51] Int. Cl.² .............................................. H01L 41/04

[52] U.S. Cl. ...................................... 310/314; 310/325

[58] Field of Search .................... 310/8.1, 8.2, 8.3, 8.7, 310/9.8, 26; 318/116, 118; 331/116 R

[56] References Cited

U.S. PATENT DOCUMENTS

| | | | |
|---|---|---|---|
| 1,912,213 | 5/1933 | Nicolson | 310/8.1 X |
| 2,616,223 | 11/1952 | Jonker | 310/8.2 X |
| 2,848,672 | 8/1958 | Harris | 318/118 |
| 2,849,075 | 8/1958 | Godby | 310/9.8 UX |
| 3,117,768 | 1/1964 | Carlin | 310/8.7 X |
| 3,813,616 | 5/1974 | Antonevich | 310/8.1 X |

*Primary Examiner*—Mark O. Budd

*Attorney, Agent, or Firm*—Oblon, Fisher, Spivak, McClelland & Maier

[57] ABSTRACT

A supersonic transducer including means for detecting its vibrating speed and for changing the frequency of the energizing current in response thereto. This invention utilizes the property that when an electrostrictive vibrator is vibrated resonantly, its dynamic admittance varies depending upon the difference in its stress distribution. The electrostrictive vibrator is divided into portions of large and small stresses to cancel the applied brake currents. Simultaneously, a signal is derived that is proportional to the difference of the dynamic currents so as to provide an effective energization by detecting the resonant frequency of the vibrator in order to automatically adjust the applied frequency of the supersonic transducer.

1 Claim, 17 Drawing Figures

Fig.1a
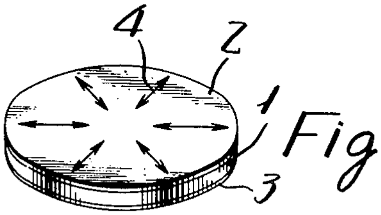
Fig.2a
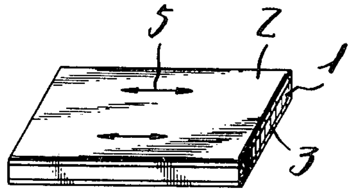
Fig.1b
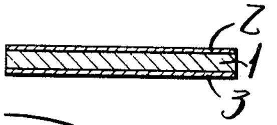
Fig.2b
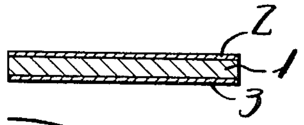
Fig.1c
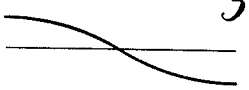
Fig.2c
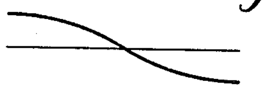
Fig.1d
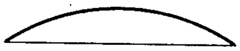
Fig.2d
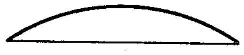
Fig.3a
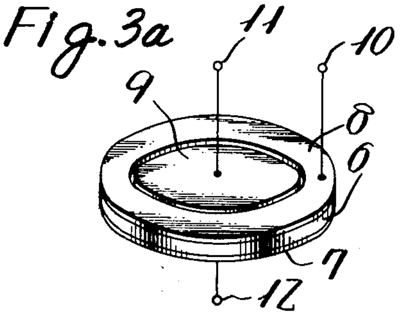
Fig.4a
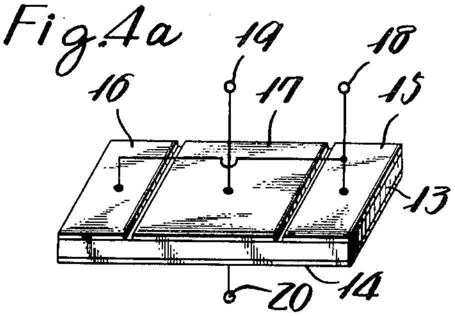
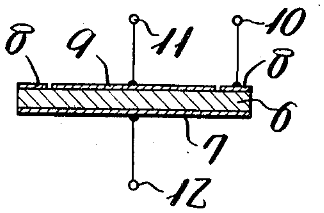
Fig. 3b
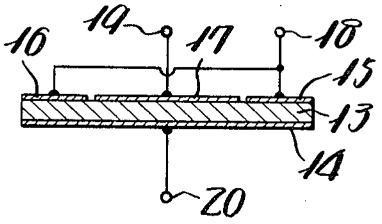
Fig. 4b

SUPERSONIC VIBRATOR WITH MEANS FOR DETECTING VIBRATING SPEED

This is a continuation of application Ser. No. 497,282, filed Aug. 14, 1974, now abandoned, which in turn is a continuation of application Ser. No. 345,530, filed Mar. 28, 1973, now U.S. Pat. No. 3,843,897.

BACKGROUND OF THE INVENTION

1. Field of the Invention

This invention relates to a supersonic transducer, and more particularly to a supersonic transducer which detects a frequency signal to be energized under varying temperature and load conditions which result in a varying resonant frequency.

2. Description of the Prior Art

In an electrostrictive vibrator, piezo-electric electrostrictive materials such as lead titanate zirconate are utilized. It is possible to produce various shaped vibrators because the powder of the above electrostrictive material is poured into a mold when produced. For example, the vibrator may have shapes such as cylindrical, circular disc, rectangular plate, prismatic, or other shapes may be produced depending upon its desired utility. Also, since a polarization is applied after it is unglazed, the orientation of the polarization may be freely selected. Since it is a strong dielectric, its electric capacity is large and, as its electric impedance is very small, the energizing voltage to be applied between both electrodes may be small, and accordingly it has characteristics very easily controlled. Thus, it may be utilized in many fields. There is known in the art one type of vibrator known as Langevin's vibrator for producing a resonant frequency of several kHz by placing an electrostrictive vibrator between two metal blocks. One problem associated with such electrostrictive vibrators is the variation of resonant frequeny of the vibrator according to the temperature and load conditions. The frequency of the energizing voltage may be displaced thereby, and it may become impossible to vibrate the device. When the Q factor generally becomes high so that the mechanical resonance of its vibrating system is operating at its peak, the foregoing tendency becomes serious. From such reasons, various structures have been tried for positively detecting the resonant frequency of the vibrator and for feeding back the detected signal to an oscillator for automatic tuning of the same. This type of vibrator typically provides a feedback electrode in addition to an energizing electrode for picking up a signal corresponding to the resonant frequency. In other words, a detecting pick-up element is provided in the vibrator, and generally it performs effectively, but since its detected voltage is extremely low, its electrical control is difficult. Also, if the area of the feedback electrode is enlarged, it tends to vibrate effectively so that it cannot obtain the desired results.

In addition to the above system, there exists in the prior art means for electrical detection by utilizing a bridge circuit, or a known method by mechanical means, but they require an artificial load, and are difficult to control electrically.

SUMMARY OF THE INVENTION

It is therefore a main object of the present invention to provide a supersonic transducer which provides a positive detection signal for vibrating it effectively.

Another object of the present invention is to provide a supersonic transducer which may automatically follow the frequency of the energizing power supply based on a detection signal that corresponds to the variation thereof.

A further object of the present invention is to provide a supersonic transducer which comprises a simple compact electrostrictive element.

Still another object of this invention is to provide a supersonic transducer which provides an effective detecting signal of a circular, rectangular or cylindrical electrostrictive vibrator which drives an energizing power supply.

Still another object of this invention is to provide a supersonic transducer which detects an effective detecting signal in Langevin's vibrator.

Briefly, in accordance with the invention, a supersonic transducer is provided which includes means for detecting its vibrating speed and for automatically adjusting the frequency of the exciting current in response thereto. The positive electrode plates adjacent the vibrating element are divided into portions such that a main portion is adjacent the section of the vibrating element having the largest vibrational stress. The other portions of the positive electrode plates are made equal in total area to the area of the main portion such that their respective brake admittances will be equal. When energized, however, their respective dynamic admittances will be unequal. The difference in detected current between the main portion and the other portions will be indicative of this difference in dynamic admittance, and thus will be indicative of the actual vibrating speed of the vibrating element. Detection and feedback means are provided to adjust the applied signal in response to the aforedescribed detected signal and thus, vibration will occur at optimum excitation conditions.

BRIEF DESCRIPTION OF THE DRAWINGS

These and other objects, features and advantages of the present invention will become more fully apparent from a consideration of the following description when taken in conjunction with the accompanying drawings, in which:

FIG. 1 shows perspective and cross-sectional views of a conventional circular electrostrictive vibrator vibrating in its radial direction showing its operating state;

FIG. 2 shows perspective and cross-sectional views of a rectangular electrostrictive vibrator vibrating longitudinally showing its operating state;

FIG. 3 shows perspective and sectional views of a circular electrostrictive vibrator constructed according to the present invention;

FIG. 4 shows perspective and sectional views of a rectangular electrostrictive vibrator in accordance with the present invention;

DESCRIPTION OF THE PREFERRED EMBODIMENTS

Figure 5:
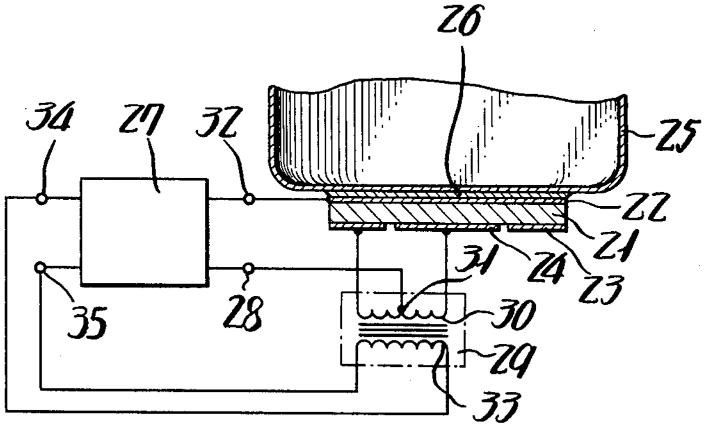
FIG. 5 is a sectional view of the vibrator of the present invention utilized in a cleaner.

Referring now to the drawings, wherein like reference numerals represent identical or corresponding parts throughout the several views, and more particularly to FIG. 1 (*a*) thereof, there is illustrated a conventional circular electrostrictive vibrator comprising an electrostrictive element 1, and electrode thin films 2 and 3 made of, for example, silver, provided by a deposition or other method on both surface of the electrostrictive element 1, which is polarized in the thickness direction.

When the vibrator is vibrated through the electrode films 2 and 3 by means of an energizing power supply having a vibrational resonant frequency along the radial direction of the electrostrictive vibrator, it vibrates in the direction as illustrated by the arrows 4. A radial sectional view is shown by FIG. 1(*b*), the distribution of the vibrating speed of the vibrator is shown in FIG. 1(*c*), and the distribution of the vibrational stress is illustrated by FIG. 1(*d*).

FIG. 2 shows a conventional rectangular electrostrictive vibrator comprising an electrostrictive element 1 and electrode thin films 2 and 3 provided on both surfaces of the electrostrictive element 1 for operating in vibrating direction as shown by arrows 5. The longitudinal section is shown by FIG. 2(*b*), the distribution of the vibrating speed of the vibrator is shown in FIG. 2(*c*), and the distribution of vibration stress is illustrated in FIG. 2(*d*).

Referring now to FIG. 3, one embodiment of the present invention is shown as a circular electrostrictive vibrator that is provided with means for detecting its vibrating speed. FIG. 3(*a*) is its perspective view, and FIG. 3(*b*) is its radial sectional view.

In the embodiment shown in FIG. 3, there is provided an electrode surface 7 on one surface of an electrostrictive element 6, and electrode surfaces 8 and 9 of silver thin films divided into a ring portion 8 and a center portion 9 so as to be coaxial and so that the respective brake admittances to the electrode surface 7 are equal. More particularly, the electrode surfaces 8 and 9 are designed so as to be substantially the same in area.

A lead wire 10 is provided from electrode surface 8 of the electrostrictive vibrator, a lead wire 11 is connected to electrode surface 9, and a lead wire 12 is attached to electrode surface 7.

In the electrostrictive vibrator thus constructed, the lead wires 10 and 11 are connected to one electrode of an energizing power supply, and the lead wire 12 is connected to the other electrode thereof. When the frequency of the energizing power supply is tuned with the resonant frequency in the radial direction of the electrostrictive vibrator, the exciting current flowing to the electrode surfaces 8 and 9 becomes the composite current of the currents flowing to the respective brake admittance and dynamic admittance. As is clear from the structure of the vibrator, however, the electric current flowing to the respective brake admittances becomes the same, while the electric current flowing to the respective dynamic admittance is always larger at the portion of electrode surface 9 having the larger distribution of the vibrating stress.

Therefore, if the difference between the electric currents flowing through the lead wires 10 and 11 is detected by a bridge circuit or a differential current transformer, the difference between the electric currents flowing through both dynamic admittances which represents the electric signal proportional to the vibrating speed, may be effectively detected.

FIG. 4(*a*) shows one embodiment of a rectangular electrostrictive vibrator according to the present invention which includes means for detecting the vibrating speed. There is provided one electrode surface 14 on one surface of an electrostrictive element 13, and electrode surfaces 15, 16 and 17 of silver thin films divided into three portions as shown. The center portion 17 has a larger vibrating stress perpendicular to the vibrating direction of the vibrator, and both ends 15 and 16 have a smaller vibrating stress so that the brake admittance of the center portion and composite brake admittances of both ends with respect to the electrode surface 14 becomes the same. FIG. 4(*b*) shows a sectional view of the vibrator in its vibrating direction.

Further, a lead wire 18 is provided from the electrode surfaces 15 and 16, a lead wire 19 is provided from electrode surface 17, and a lead wire 20 is provided from electrode surface 14.

When the lead wires 18 and 19 are connected to one electrode of an energizing power supply and the lead wire 20 is connected to the other electrode thereof, and the frequency of the energizing power supply is tuned with the longitudinal resonant frequency of the electrostrictive vibrator, the electric current flowing to the respective brake admittances of the current flowing to the lead wires 18 and 19 will be the same, and the component of the electric current of the current flowing to the respective dynamic admittance flowing to lead wire 19 is always larger than that of the current flowing to the lead wire 18 being similar to the embodiment shown in FIG. 3.

Therefore, the difference of the electric currents flowing through leads wires 18 and 19 can be detected by a bridge circuit or a differential current transformer so that the detected signal will be an electric signal proportional to the vibrating speed.

Although the embodiment shown in FIG. 4 illustrates a rectangular electrostrictive vibrator, other shapes of electrostrictive vibrators may also embody the principles of this invention as will be clear to those skilled in the art.

Though the respective electrode surfaces divided into two blocks responsive to the vibrating stress are constructed so as to be equal in their brake admittances in the above embodiments, even if they are so constructed that the brake admittances therebetween are different, it will be clearly understood by those skilled in the art that if they are so constructed that the electric current flowing into both brake admittances by a bridge circuit or differential current transformer may be cancelled by each other, that the vibrating speed may be effectively detected in the electrostrictive vibrator in accordance with the teaching herein.

Referring now to FIG. 5, another embodiment of the circular electrostrictive vibrator of this invention is shown in combination with an AFC cleaner as a transducer.

In FIG. 5, a circular electrostrictive vibrator having electrode surfaces 22, 23 and 24 on both surfaces of an electrostrictive element 21 is mounted through an adhesive 26 onto the bottom surface of a cleaner 25. One output terminal 28 of a feedback oscillator 27 is connected to intermediate tap 31 of a primary winding 30 of a differential current transformer 29. Both ends of the primary winding 30 are connected to the divided electrode surfaces 23 and 24, and the other output terminal 32 of feedback oscillator 27 is connected to the other electrode surface 22. Both ends of a secondary winding 33 of differential current transformer 29 are connected to the input terminals 34 and 35 of feedback oscillator 27.

In the vibrator constructed according to the foregoing, the exciting current fed from output terminal 28 of the feedback oscillator 27 flows through intermediate tap 31 or primary winding 30 of differential current transformer 29 to the electrode surfaces 23 and 24. The difference of the exciting current flow through both electrode surfaces 23 and 24 produces a voltage proportional to the vibrating speed in the secondary winding 33 which operates as the input signal of the feedback oscillator 27. Here, the voltage drop produced at the primary winding 30 of the differential current transformer 29 becomes small in comparison with the exciting voltage between the output terminals 28 and 32.

In the cleaner thus constructed, the oscillating frequency of feedback oscillator 27 always follows the variations of the resonant frequency of the electrostrictive vibrator according to the capacity of the cleaning liquid filled in the cleaning container 25, the temperature, or any other external conditions so as to operate the vibrator in an optimum state.

The foregoing description illustrates a method of detecting the vibrating speed signal of this invention by cancelling part of the brake admittance of the electrostrictive vibrator against part of the brake admittance of the same electrostrictive vibrator. It differs from the conventional art which typically comprises detection by an external element or separation of the artificial load. The present invention decreases the error based on the temperature difference, error due to drive level or change due to aging of the brake admittance, and provides a simple structure along with its remarkable advantages.

Figure 6:
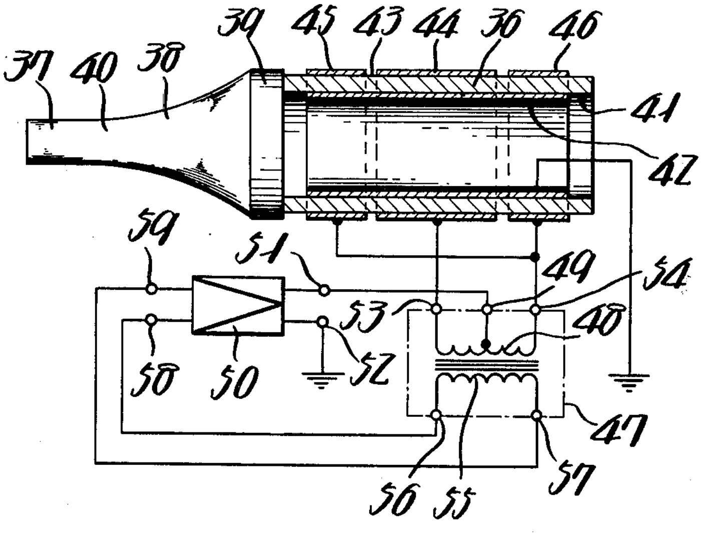
FIG. 6 is a sectional view of a cylindrical electrostrictive vibrator according to the present invention with an electric circuit.

FIG. 6 shows still another embodiment of a vibrator in cylindrical shape according to the principles of the present invention. This embodiment of the electrostrictive vibrator has a vibrator body 36 made of piezo-electric electrostrictive material, such as lead titanate zirconate, in cylindrical shape. To one end of body 36 is fixed a metal resilient member 40 comprised of a smaller diameter parallel portion 37, an exponentially shaped portion 38 and a larger diameter parallel portion 39. Common electrode 42 is provided by means of deposition or silver seizure over the entire inner peripheral surface 41 of the vibrator body 36. A center electrode 44 is formed at the center of the outer peripheral surface 43 of vibrator body 36, and end electrodes 45 and 46 are formed on both sides of the center electrode 44. The area of the center electrode 44 is substantially equal to the combined areas of the end electrodes 45 and 46, and the brake admittance of the common electrode 42 is determined so as to equalize the same.

This vibrator is also provided with a differential current transformer 47 as detecting means. As output terminal 51 of the feedback oscillator 50 being an energizing power supply is connected to the intermediate tap 49 disposed along the primary winding 48 of the differential current transformer 47. The other output terminal 52 is grounded. The terminal 53 of primary winding 48 is connected to center electrode 44, and the other terminal 54 is connected to end electrodes 45 and 46. The common electrode 42 is grounded as shown. The terminals 56 and 57 of the secondary winding 55 of transformer 47 are connected to the input terminals 58 and 59, respectively, of the feedback oscillator 50.

In the operation of such a vibrator, if the feedback oscillator 50 is driven by a frequency approximately corresponding to the resonant frequency of the vibrator body 36, the vibrator body 36 resonantly vibrates. An exciting voltage is applied from output terminal 51 of feedback oscillator 50 through primary winding 48 of differential current transformer 47 to center electrode 44 and end electrodes 45 and 46, thus energizing the vibrator. Since the total area of the center electrode 44 and end electrodes 45 and 46 is substantially the same as that of the common electrode 42, very effective energization is achieved. Since the electric current flowing through the center electrode 44 and the end electrodes 45 and 46 are in series opposition in the primary winding 48, the electric current based on the brake admittance of the center electrode 44 and that based on the brake admittances of the end electrodes 45 and 46 will be the same in value, and accordingly there will not be produced any induced current in the secondary winding 55 of the transformer. The brake admittance may simply increase in response to the frequency, but since the frequency conditions of both are the same in this case, it need not be considered. Distortions produced at the center of center electrode 44 and at the ends of end electrodes 45 and 46 are different during the energization of vibrator body 36 such that the internal stress is larger at the center than at the ends. As a result, the dynamic admittance at center electrode 44 is far larger than those of electrodes 45 and 46 so that the electric current flowing from intermediate tap 49 to terminal 53 of differential current transformer 47 is larger than that flowing from intermediate tap 49 to terminal 54. Accordingly, the electric current based on the dynamic admittance will be the difference between the current in center electrode 44 and end terminals 45 and 46 so that the induced current based on this difference flows through the secondary winding 55. Since the electric current flowing through the secondary winding 55 has the characteristic that it changes frequency according to the dynamic admittance, its value corresponds to the state of resonant vibration of vibrator body 36. Therefore, it is seen that the vibrating speed can be detected by measuring the current value.

Since terminals 56 and 57 of secondary winding 55 are connected to input terminals 58 and 59 of feedback oscillator 50, the signal based on the vibrating speed of the vibrator body 36 is always fed back. Feedback oscillator 50 is controlled thereby so as to produce an output of the oscillating frequency that follows the vibrating speed of the vibrator body 36. Thus, the detecting signal is given to feedback oscillator 50 in order to provide automatic frequency control.

The brake admittances of center electrode 44 and end electrodes 45 and 46 of vibrator body 36 may not always coincide with each other so as to produce the above desired results. However, the device may be constructed so as to cancel the electric current by an electrical treatment at the detecting portion. As to the detecting portion, a bridge circuit may be utilized instead of the differential current transformer, and, in fact any means which picks up the signal proportional to the dynamic admittance may be utilized.

It should be understood from the foregoing description that since the vibrator of this invention has the center and end electrodes on one peripheral surface of the cylindrical vibrator body used as the energizing electrodes and is simultaneously connected to the detecting portion for picking up the signal proportional to the electric current based on the dynamic admittance while cancelling the brake admittance, it may effectively obtain the detecting signal while effectively driving it. Thus, it is not necessary to provide the pickup element only for detecting an artifical load as seen in the prior art detecting devices so that the present structure is seen to be more simple in its operation. Also, a detecting signal having a sufficient output is readily obtainable and further the present invention sufficiently eliminates errors in the detecting of the vibrating speed such as an error based on the temperature difference from the artificial load, error of the drive level, or error due to the aging change of the brake admittance.

Figure 7:
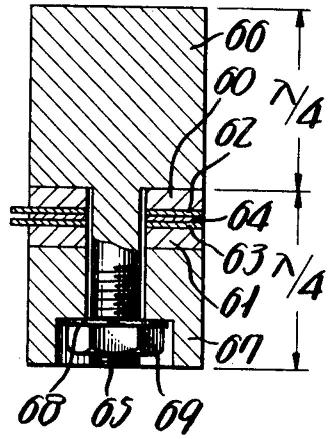
FIG. 7 is a sectional view of Langevin's vibrator.

FIG. 7 shows still another embodiment of an electrostrictive vibrator according to the present invention having annular electrostrictive elements made of a piezo-electric electrostrictive material such as lead titanate zirconate.

This embodiment comprises annular electrostrictive elements 60 and 61 of the same characteristics made of a piezo-electric electrostrictive material such as lead titanate zirconate, electrode plates 62 and 63, and a resilient insulator 64 interposed between the annular electrostrictive elements 60 and 61 and the electrode plates 62 and 63, as shown. A circular cylindrical metal resilient body 66 having a bolt 65 at the center axis thereof is also provided in combination with a circular cylindrical metal resilient body 67 having a center hole tightened from both sides of the electrostrictive elements 60 and 61 by bolt 65, washer 68 and nut 69. The axial length of the circular cylindrical resilient body 66 excluding the bolt 65 is selected to be substantially one-fourth of the wavelength of the intrinsic resonant frequency of the vibrator. The axial length of the circular cylindrical metal resilient body 67 including the electrostrictive elements 60 and 61 is similarly selected to be substantially one-fourth of the wavelength of the intrinsic frequency.

The features of the conventional Langevin's vibrator in FIG. 7 include the provision of the resilient insulator 64 added with the electrode plates 62 and 63 facing oppositely to the electrostrictive elements 60 and 61. Further, another important feature is that the electrostrictive elements 60 and 61 are arranged at positions which are different in stress distribution along the axial direction of the vibrator.

In this embodiment, if electrostrictive elements 60 and 61 are connected in parallel, that is, the electrode plates 62 and 63 are connected to one electrode of the energizing power supply and the circular cylindrical metal resilient bodies 66 and 67 which are in contact with the other surfaces of elements 60 and 61, respectively, are connected to the other electrode of the energizing power supply so that the frequency of the energizing power supply is tuned with the intrinsic resonant frequency of the Langevin's vibrator, the electric current flowing to the dynamic admittances of electrostrictive elements 60 and 61 is always larger by the current flowing into the electrostrictive element 60 disposed at the part having the larger vibrating stress than the electrode current flowing into the electrostrictive element 61 disposed at the part having the smaller vibrating stress.

On the other hand, the electric currents flowing into the brake admittance of electrostrictive elements 60 and 61 which have the same characteristics, are the same. Therefore, if an electric signal proportional to the difference between the exciting currents flowing into electrostrictive elements 60 and 61 are fed to a bridge circuit or a differential current transformer, an electric signal proportional to the difference of the electric current flowing into the dynamic admittances of electrostrictive elements 60 and 61, that is, the electric signal proportional to the vibrating speed of the Langevin's vibrator, may be effectively detected.

The resilient insulator 64 in the above embodiment is preferably made of resilient material having favorable heat conductivity and electric insulation characteristics such as, for example, a thin film printed substrate of alumina porcelain, beryllia porcelain, or epoxy resin containing copper foil glass fiber on both surfaces thereof as an insulator adjacent electrode plates 62 and 63 so as to facilitate easy heat exchange between the electrostrictive elements 60 and 61. The voltage applied to both surfaces of any resilient insulator is small, thus its voltage endurance is not a problem and therefore, sufficiently thin material may be utilized.

It is, of course, possible that resilient insulator 64 can be omitted. Then, bolt 65 and circular cylindrical metal resilient body 67 will be insulated in its structure, the electrode plates facing oppositely of the electrostrictive elements 60 and 61 constituting one electrode, while the circular cylindrical metal resilient bodies 66 and 67 contacting with both outer surfaces of the electrostrictive elements 60 and 61 constituting another electrode, so as to operate it within the spirit and scope of the present invention.

Figure 8:
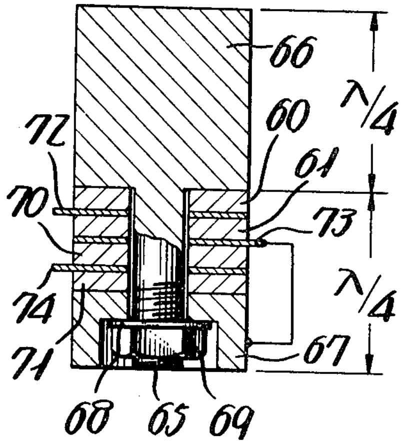
FIG. 8 is a sectional view of another embodiment of the vibrator of this invention.

FIG. 8 shows another embodiment of the electrostrictive vibrator comprised of four electrostrictive elements which does not require the resilient insulator 64 as seen in the embodiment shown in FIG. 7.

Referring now to FIG. 8, annular electrostrictive elements 60, 61, 70 and 71 of the same characteristics are superimposed by changing the polarizing direction step by step through electrode plates 72, 73 and 74, respectively, and are tightened from both outside surfaces thereof by the metal resilient bodies 66 and 67 by means of bolt 65, washer 68 and nut 69. Electrode plate 73 is connected through the metal resilient body 67 to one electrode of the energizing power supply, and the electrode plates 72 and 74 are connected to the other electrodes of the energizing power supply.

The difference of the current flowing from electrode plate 72 to the electrostrictive elements 60 and 61 and that flowing from electrode plate 74 to electrostrictive elements 70 and 71 may be detected as the signal proportional to the vibrating speed by a bridge circuit or a differential current transformer.

Although the electrostrictive elements 60, 61, 70 and 71 are disposed from the node portion of the amplitude of the vibration toward the end surface, it does not necessarily limit their positions, they may be disposed more in the vicinity of the end surface.

Figure 9:
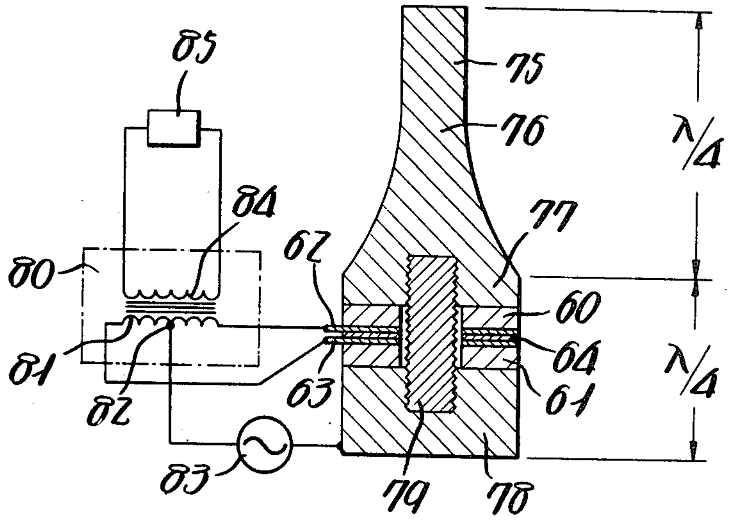
FIG. 9 is a sectional view of a vibrator of the present invention with an amplitude expanding horn.

FIG. 9 shows still another embodiment of the vibrator in combination with a step horn having a conventional exponential step portion, in which part of the vibrator is formed to a required shape, as will become apparent hereinafter.

In FIG. 9, a metal resilient body comprised of a small diameter parallel portion 75, an exponential step 76 and a large diameter parallel portion 77, and a metal resilient body 78 having the same diameter as that of the larger diameter parallel portion 77 are tightened in a sandwich fashion around the electrostrictive elements 60 and 61, resilient insulator 64 and electrode plates 62 and 63 by means of a bolt 79, so that the vibrating speed of the smaller diameter end surface is increased from the vibrating speed of the larger diameter end surface.

In FIG. 9, means for detecting the vibrating speed by a differential current transformer 80 is illustrated. An intermediate tap 82 is provided to a primary winding 81 and is connected to one electrode of the energizing power supply 83, and both ends of the primary winding 81 are connected to the electrode plates 62 and 63 of the vibrator. The other electrode of the energizing power supply 83 is connected to the metal resilient body 78.

The differential current transformer 80 is so constructed that the voltage drop produced at the primary winding 81 is sufficiently small compared with the exciting voltage of the energizing power supply 83.

A load 85 is connected to both ends of the secondary winding 84 of the differential current transformer 80 so that a detection signal proportional to the vibrating speed is obtained.

The positions of the electrostrictive elements 60 and 61 are displaced from the node portion of the amplitude of the vibration toward the large diameter end surface, and since the difference of the stresses applied to the respective electrostrictive elements becomes large, the detection signal indicative of the vibrating speed also becomes large.

In the above embodiment, although the electrostrictive element group divided to two sets of blocks responsive to the vibrating stress is so constructed so as to be equal in brake admittance of the respective blocks, even if the brake admittance of the respective blocks are constructed so as to be different, if it is nevertheless constructed so that the current flowing into both brake admittances may be cancelled by a bridge circuit or differential current transformer, the Langevin's electrostrictive vibrator may still effectively detect the vibrating speed.

According to the present invention, the vibrator adhered by the adhesive in the conventional Langevin's vibrator may effectively detect the vibrating speed regardless of the construction of the bolting of the outer periphery or center.

The errors of the detection of the vibrating speed produced by the detecting element, the artificial load, the temperature difference of the vibrator, the difference in temperature characteristics, or lack of coincidence of various conditions such as the drive level, etc., apparent in the detecting device of conventional electrostrictive elements, are eliminated by the present invention. Also, the electrostrictive vibrator of the present invention may be simply constructed and is of low cost.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States:

1. A supersonic vibrator comprising:

a first cylindrical metallic resilient body, a second cylindrical metallic resilient body, first, second, third and fourth annular electrostrictive elements disposed between the first and second cylindrical metallic resilient bodies, the first annular electrostrictive element contacting the first cylindrical metallic resilient body and the fourth annular electrostrictive element contacting the second cylindrical metallic resilient body, a first annular electrode plate disposed between the first and second annular electrostrictive elements, a second annular electrode plate disposed between the second and third annuular electrostrictive elements, a third annular electrode plate disposed between the third and fourth annular electrostrictive elements, means joining the first and second cylindrical metallic resilient bodies for tightening the first, second, third and fourth annular electrostrictive elements, means electrically connecting the second annular electrode plate to the second cylindrical metallic resilient body, an energizing power supply having one electrode connected to the second cylindrical metallic resilient body and other electrodes connected to the first and third annular electrode plates, the axial length of the first cylindrical metallic resilient body being substantially one-fourth of the wavelength of the intrinsic resonant frequency of the vibrator;

the axial length of the second cylindrical metallic resilient body when combined with the axial lengths of the first, second, third and fourth annular electrostrictive elements and the axial lengths of the first, second and third annular electrode plates being substantially one-fourth of the wavelength of the intrinsic resonant frequency of the vibrator, means for detecting the difference of the current flowing from the first annular electrode plate to the first and second annular electrostrictive elements and the current flowing from the third annular electrostrictive element to the third and fourth annular electrostrictive elements as representative of the vibrating speed of the vibrator.

* * * * *